(12) United States Patent
Ali

(10) Patent No.: US 6,292,046 B1
(45) Date of Patent: Sep. 18, 2001

(54) CMOS ELECTROSTATIC DISCHARGE PROTECTION CIRCUIT WITH MINIMAL LOADING FOR HIGH SPEED CIRCUIT APPLICATIONS

(75) Inventor: Akbar Ali, Garden Grove, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/163,675

(22) Filed: Sep. 30, 1998

(51) Int. Cl.$^7$ ........................................... H03K 5/08
(52) U.S. Cl. ............................. 327/310; 327/313; 361/56
(58) Field of Search ........................... 327/108, 111, 327/112, 170, 379, 380, 381, 310, 313, 314; 361/56, 91; 326/26, 27

(56) References Cited

U.S. PATENT DOCUMENTS

| | | | |
|---|---|---|---|
| 4,800,303 | * | 1/1989 | Graham et al. ........................ 326/72 |
| 4,855,620 | * | 8/1989 | Duvvury et al. ..................... 326/119 |
| 5,208,719 | * | 5/1993 | Wei ...................................... 361/56 |
| 5,473,500 | * | 12/1995 | Payne et al. ......................... 361/91 |
| 5,521,783 | * | 5/1996 | Wolfe et al. ......................... 361/91 |
| 5,610,791 | * | 3/1997 | Voldman .............................. 361/56 |
| 5,615,073 | * | 3/1997 | Fried et al. .......................... 361/56 |
| 5,744,842 | * | 4/1998 | Ker ...................................... 257/362 |
| 5,963,409 | * | 10/1999 | Chang .................................. 361/56 |
| 5,986,867 | * | 11/1999 | Duvvury et al. .................... 361/56 |
| 6,046,480 | * | 4/2000 | Matsumoto et al. ................ 257/355 |

* cited by examiner

Primary Examiner—Kenneth B. Wells
Assistant Examiner—Paul Dinh
(74) Attorney, Agent, or Firm—Farjami & Farjami LLP

(57) ABSTRACT

The present invention relates to a circuit for protecting inputs and outputs on semiconductor devices. The protective circuit is particularly useful on high-speed inputs or outputs (such as in radio frequency applications where signal frequency is on the order of 100 MHz or greater and where it is necessary to minimize capacitive loading. Briefly, the present invention utilizes two FETs to shunt harmful electrostatic charges to a low impedance power bus and protect input and output circuit elements from damage or degradation. When a high voltage transient surge is detected, the drain-gate capacitance of one of the FETs couples the voltage to the gate electrode and biases one of the two transistors in the low impedance state so that the surge is absorbed without damage to the input or output circuit. Significantly, the capacitive loading of the protection circuit of the present invention is typically a fraction of a picoFarad and more particularly on the order of several hundred femtofarads.

22 Claims, 3 Drawing Sheets

CMOS ELECTROSTATIC DISCHARGE PROTECTION CIRCUIT WITH MINIMAL LOADING FOR HIGH SPEED CIRCUIT APPLICATIONS

BACKGROUND OF THE INVENTION

The present invention relates to a circuit that protects the inputs and outputs of a semiconductor devices from damage caused by electrostatic discharge (ESD) and more specifically, to an ESD protection circuit for inputs and outputs of radio frequency semiconductor devices.

In semiconductor devices, device geometry has scaled down with improvements in photolithography and diffusion processing technology. Indeed, it is becoming increasingly common for high-speed semiconductor devices to include millions of transistors where the dimensions of the transistors have been scaled down to sub-micron range. Advantageously, as the dimensions of the transistors (most particularly the channel length) are reduced, the time delay per stage decreases by a corresponding factor. Thus, as transistors are scaled to sub-micron dimensions, the time delay per stage decreases and the circuits may operate at higher clock rates. Accordingly, such semiconductor devices are now commonly used for radio frequency (RF) or microwave frequency applications. Recently, complementary metal-oxide semiconductor (CMOS) devices operating at radio frequencies have minimum transistor geometry on the order of 0.35 microns while some semiconductor devices have more recently been introduced with 0.18 micron minimum geometry.

Unfortunately, semiconductor devices manufactured with channel lengths of 0.35 microns or smaller, are extremely susceptible to damage from high voltages due to very thin gate oxide covering the channel. Such semiconductor devices are particularly susceptible to damage from uncontrolled discharge of accumulated electrostatic charges that readily accumulate on the human body. As will be appreciated by one familiar with semiconductor processing, transistors that interface with "off-chip" devices are most susceptible to damage or degradation from electrostatic discharge (ESD).

Electrostatic charge accumulation on nonconductive bodies is a common phenomenon that has been well documented. Indeed, human-body models are well known in the art describing the extremely high static charge that can build up on a person by friction, electrostatic induction or by other means. A significant problem for manufacturers and users of products that include semiconductor devices is that the human body can generate and accumulate an electrostatic charge that can easily destroy sensitive semiconductor devices when a charged person handles the device. Without protection from the accumulated charge or its suppression, an uncontrolled discharge through one or more inputs or outputs of the semiconductor device can damage or degrade transistors or other electrical components.

For this reason, many semiconductor devices include protection circuits that are designed to shunt the accumulated charge to either the power or the ground bus. One common protection circuit employs large diodes (p-n junctions) coupled between the input or output and a power bus. This diode structure typically protects inputs or outputs from electrostatic discharge up to about 2,500 volts. When an input or output of a semiconductor device is subjected to an electrostatic charge, these diodes will switch to a conductance mode to provide a short circuit path to a power bus to dissipate the surge and then rapidly turn "off."

Such protection circuits are more than adequate for semiconductor devices that operate at relatively low frequencies, for example, at or below 100 MHz. However, for semiconductor devices that operate at high frequencies, it is not possible to depend on the prior art ESD protection circuits because of capacitive loading. It is also well known that the overall performance of a system may be seriously degraded if one or more outputs must drive a large capacitive load. Since the prior art protection circuits noted above may introduce up to several tens of picoFarads (e.g. 100 pF) at each output, the use of such protective circuits is generally avoided in circuit applications that require high signal rates. Further at the higher operating frequencies typically encountered in RF applications, capacitive load tends to act as a low impedance creating signal distortion and low impedance paths to power or ground during normal operation greatly increasing input or output power drain.

For these reasons, many manufacturers of semiconductor devices tend to forego protection from ESD on the high-speed inputs and outputs. Indeed, minimizing the capacitive loading to ensure proper operation of the device at high operating rates is often deemed more important than protecting the device from the potential of ESD-induced damage or degradation. However, without protection on the high-speed inputs and outputs, special handling and storage precautions are required to minimize the potential for damage from ESD.

Unfortunately, such precautions are expensive, time consuming to implement, an annoyance to manufacturing personnel and often ineffective. Thus, without any protection at the signal line, these unprotected signal lines are susceptible to damage from ESD or other voltage transients even when securely mounted on a circuit board. Electrostatic discharge can easily damage or degrade unprotected signal lines to a degree where the device may simply cease to function.

In another prior art protection circuit commonly used in bi-polar semiconductor technology, a pair of NPN transistors couple each input and output to the power buses. FIG. 1 illustrates one technique for connecting such transistors. Specifically, the collector of a first transistor 5 is connected to the most positive power bus (commonly referred to as Vcc) and the emitter is connected to the signal line and the associated input or output circuit 8. In this embodiment the base of transistor 5 is left floating. A second transistor 6 has its collector connected to the circuit 8 and the emitter connected to ground or the most negative power bus (commonly referred to as Vee). The base of transistor 6 is also left floating. In this configuration, transistors 5 and 6 utilize a zener breakdown mechanism to provide ESD protection.

Accordingly, what is needed is an ESD protection circuit for CMOS devices that have one or more high-speed inputs or outputs. The ESD protection circuit must provide protection against a reasonable level of voltage such as is typically generated by a human body or typically encountered in the operating environment. What is further needed is an ESD protection circuit with minimal capacitive loading so as to minimize signal degradation or stray low impedance paths to power or ground. Further still, what is needed is an ESD protection circuit for high-speed inputs and outputs of a CMOS device. Thus, whatever the merits of the above described prior art protection circuits, they do not achieve the benefits of the present invention.

SUMMARY OF THE INVENTION

The present invention relates to a circuit for protecting inputs and outputs on complementary metal-oxide semiconductor (CMOS) devices. The protective circuit is particularly useful on high-speed inputs or outputs (such as in radio frequency (RF) applications) where signal frequency is on the order of 100 MHz or greater and where it is necessary to minimize capacitive loading. Briefly, the present invention utilizes two field effect transistors (FETs) to shunt harmful electrostatic charges to a low impedance power bus and protect input and output circuit elements from damage or degradation. When a high voltage transient surge is detected, the drain-gate parasitic capacitance of one of the FETs couples the voltage to the gate electrode and biases the transistor in the low impedance state so that the surge is absorbed without damage to the input or output circuit. Significantly, the capacitive loading of the protection circuit of the present invention is typically a fraction of a picoFarad and more particularly on the order of several hundred femtofarads.

In a second embodiment, the protection circuit further includes a string of parasitic diodes in parallel with the MFET transistors. This string of diodes prevents breakdown of the MFET transistors when the electrostatic charge is close to the rated breakdown voltage of the MFET transistors.

With recent advances in semiconductor technology it is now feasible to utilize semiconductor devices in RF applications where clock and signal rates are typically 500 MHz or greater. Obviously there is a critical need for an ESD protective circuit that does not have high power requirements in terms of power drain at high frequencies. There is also a need for an ESD protective circuit that does not excessively load the inputs or outputs. Since the protective circuit of the present invention provides minimal capacitive loading, performance of the device is not degraded. Further, with the rapid turn "on" of the present invention, both negative and positive electrostatic charges are shunted to a low impedance bus.

DETAILED DESCRIPTION OF THE INVENTION

Figure 1:
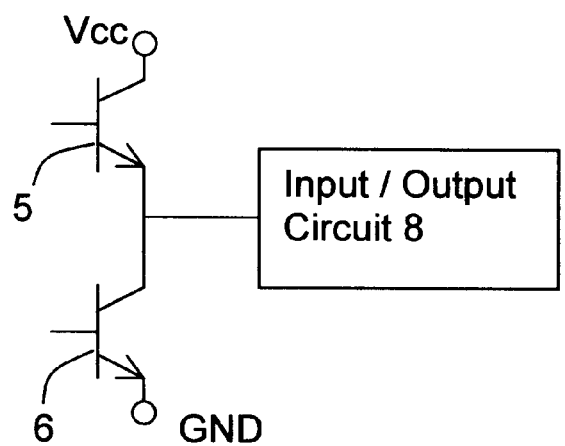
FIG. 1 illustrates a prior art protective circuit.

In the following description of the preferred embodiment, reference is made to the accompanying drawings that form a part hereof, and in which is shown by way of illustration a specific embodiment in which the invention may be practiced. It is to be understood that other embodiments may be utilized and that changes may be made without departing from the scope of the present invention.

Reference will now be made in detail to the preferred embodiments of the invention, examples of which are illustrated in the accompanying drawings. Wherever possible, the same reference numbers will be used throughout in the drawings to refer to the same or like components.

Figure 2:
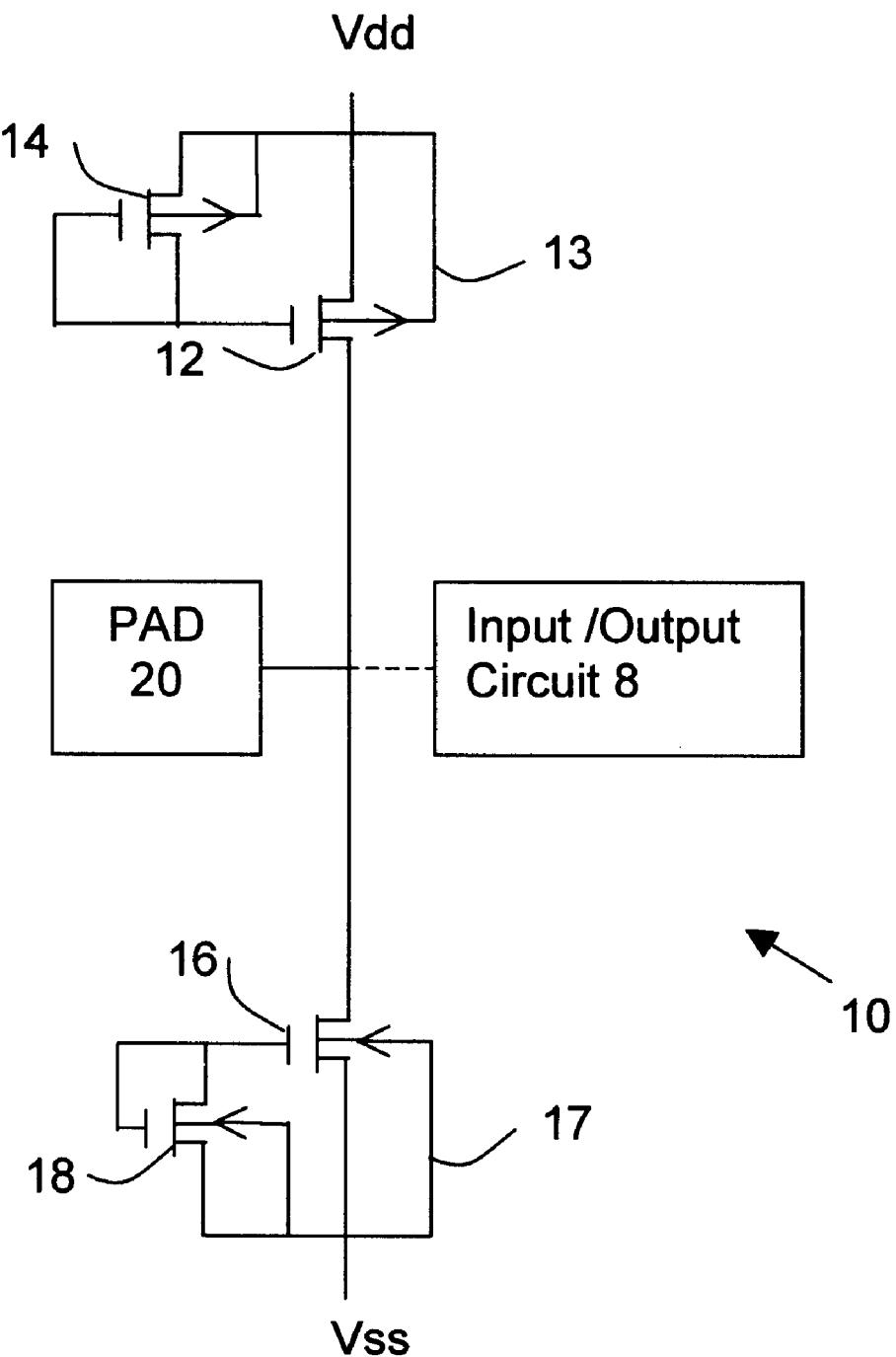
FIG. 2 shows one embodiment of the protective circuit of the present invention having minimal loading.

In FIG. 2, an electrostatic discharge (ESD) protection circuit 10 is shown for a complementary metal-oxide-semiconductor (CMOS) device having at least one input or output where the signal frequency is, by way of example, at least about 500 MHz. As noted above, the frequency limiting effect of prior art ESD protection circuits generally dictate that no ESD protection is provided on such high frequency inputs and outputs. However, with the present protection circuit 10, the capacitance is minimized while protection at a reasonably high level voltage is provided. The present invention is particularly useful in radio frequency (RF) applications where minimal capacitance is required to prevent signal loss and minimize power dissipation.

Protection circuit 10 comprises four metal oxide semiconductor field effect transistors (MFETS) 12–18. Transistors MFET 12 and MFET 14 are preferably p-channel devices while transistors MFET 16 and MFET 18 are preferably n-channel devices.

Transistor MFET 12 couples a signal pad 20 to the most positive voltage bus, Vdd. More specifically, the drain of transistor MFET 12 is connected to pad 20 and the source to the most positive voltage bus, Vdd. The body contact of transistor MFET 12 is also connected to the Vdd bus as indicated at 13. Pad 20 is coupled to the Vss bus, which may be either ground or a negative voltage, by transistor MFET 16 with the source of transistor MFET 16 connected to pad 20 and the drain connected to Vss. The body contact of transistor MFET 16 is also connected to the Vss bus as indicated at 17.

In the event of a voltage surge, such as may be generated by lightning or a discharge of a static charge, protection circuit 10 of the present invention provides a low impedance path to protect input/output circuit 8 from damage or degradation. If a voltage surge is applied to pad 20, such as may be generated by a human body discharging an accumulated static charge, either MFET 12 or 16 will turn "on" to shunt the charge to one of the low impedance power busses.

For example, if the polarity of the surge is positive at pad 20, then MFET 16 will turn "on" by the drain-gate capacitive coupling in response to a high frequency transient spike. Once the transistor is "a" low impedance path to the Vss bus is provided. Conversely, if the surge is negative, MFET 12 will turn "on" and shunt the charge to the Vdd bus. For low drain to source voltage ($V_{ds}$) levels on pad 20, MFETs 12 and 16 act as high impedance resistors and will not degrade signal levels present at pad 20. Due to the capacitive drain-gate coupling the relatively slow signals normally present at pad 20 will be unable to fully bias transistors MFETs 12 and 16 into the low impedance state. However, if the value $V_{ds}$ rapidly increases, the appropriate one of the transistors will switch "on" and act as a current source to drain the current from pad 20 and absorb the surge.

Since the gate voltage of transistors MFET 12 or MFET 16 is clamped at about 0.6 to 0.7 volts below the Vdd or above Vss bus, the gate capacitance remains constant and primarily comprises the small parasitic overlap capacitance between the gate and the source and drain regions. This capacitance is sufficiently minimal that, during normal operation, the capacitive loading on pad 20 does not adversely affect the signal. However, it will be appreciated that if the gate of a CMOS device is left floating, charge may accumulate during fabrication process and rupture the gate oxide. Accordingly, transistors MFET 14 and MFET 18 are provided to establish a leakage path to dissipate accumulated charge from the gates of MFETs 12 and 16, respectively, and provide the gate voltage clamp. Transistors MFET 14 and 18 are minimum sized transistors with the body contact of transistor MFET 14 connected to the Vdd bus and the body contact of transistor MFET 18 connected to Vss.

The rate at which transistors MFET 12 and 16 switch "on" is determined by the width to length ratio of the transistors. Not only does this ratio determine the switching rate but it also determines the protection level provided by protection circuit 10. Thus, the smaller the length and larger the width, the faster the turn-on and the higher the protection level.

However, since capacitance is proportional to the area, it is necessary to compromise and select a width that provides adequate protection. In one preferred embodiment, the process design rules specify a minimum gate length of 0.5 microns (as indicated in Table 1). But, if the design rules provide for a smaller minimum size, one skilled in the art will appreciate that the width could be correspondingly scaled to maintain the same level of protection. Such scaling will advantageously further reduce the overall capacitance at pad 20. In general, the length dimension of the transistors should be made as small as permitted by the design rules since the transistor area substantially determines the capacitance of the MFET transistors.

In one preferred embodiment, transistors MFET 12 and MFET 16 have a channel length of 0.5 microns and the channel width is selected to provide a desired level of over-voltage or ESD protection. As the area of the channel increase, the amount of capacitance will increase but the larger transistors provide the highest level of protection against ESD surges. As shown in Table 1, for a channel width and length of about 500 microns, the MFET transistors provide protection form ESD surges up to about 1,200 volts. For a transistor of this size, the gate to drain capacitance plus the drain to bulk plus the pad capacitance is about 1.2 picoFarads (pF) of loading as seen at pad 20. In some applications, this amount of capacitance is too large so it may be necessary to minimize the capacitance by minimizing the area of the transistors. However, by scaling the width of the transistors (as indicated in the Scaling column of Table 1), channel area will be reduced and the capacitance will scale down in a substantially linear manner.

TABLE 1

| Width (MFET1 and MFET2) Length = 0.5 μm | Capacitance (pF) ($C_{GD}$ + $C_{DB}$ + pad metal) | ESD Protection (V) | Scaling Factor |
|---|---|---|---|
| 500 | 1.2 | 1,200 | 100% |
| 200 | 0.5 | 500 | 40% |
| 100 | 0.3 | 250 | 20% |

Figure 3:
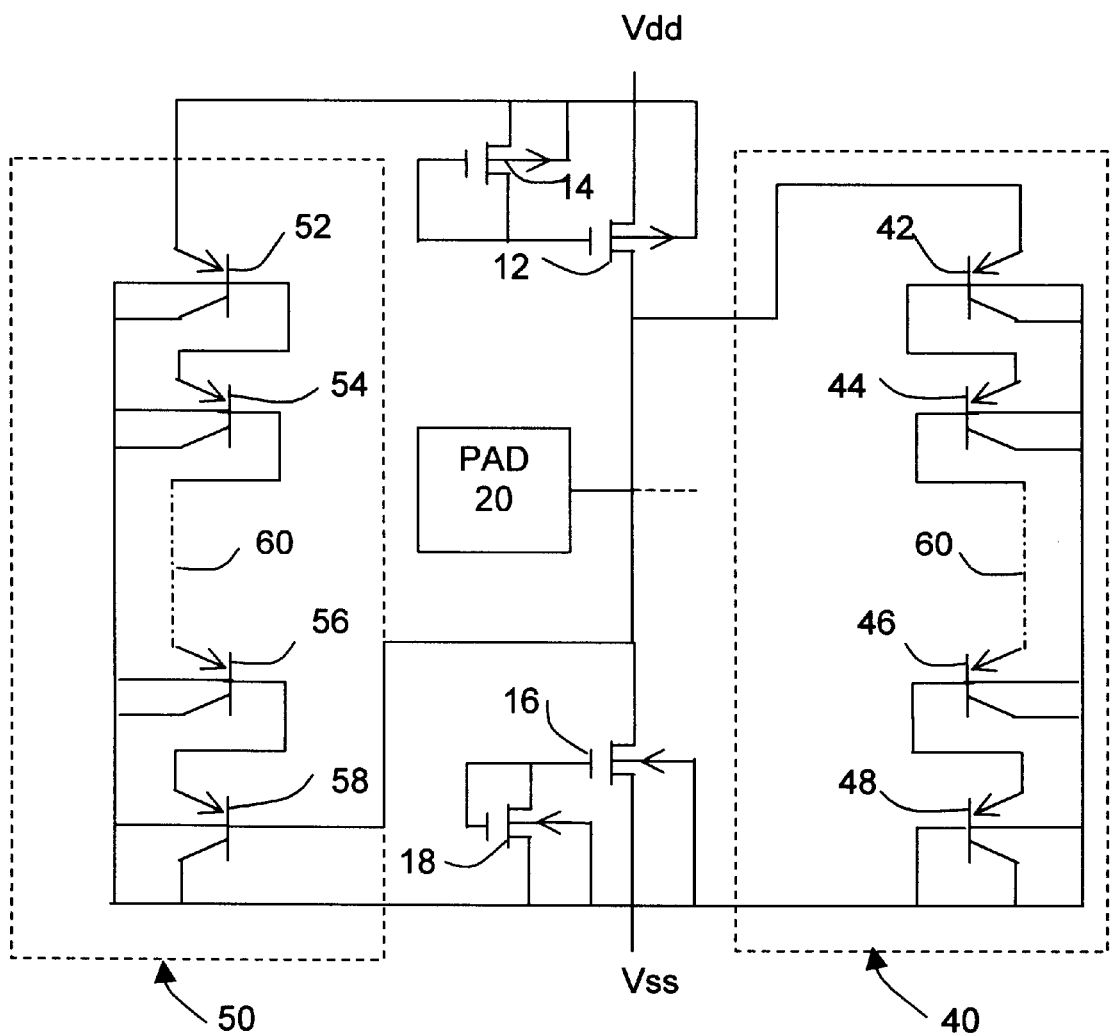
FIG. 3 shows a second embodiment of the protective circuit of the present invention having a secondary voltage clamp for providing additional protection for high speed input or outputs of a semiconductor device.

In a second embodiment shown in FIG. 3, a plurality of parasitic bipolar transistors, indicated generally at 40 and 50, are provided in parallel with the MFET transistors to provide a secondary over-voltage clamp. Transistors 42–48 are connected in series between the pad and Vss. Similarly, transistors 52–58 are series connected between the pad and Vdd. These bipolar transistors provide an over-voltage clamp that protects the MFET transistors from ESD surges that exceed the maximum source drain voltage rating of the MFET transistors.

Figure 4:
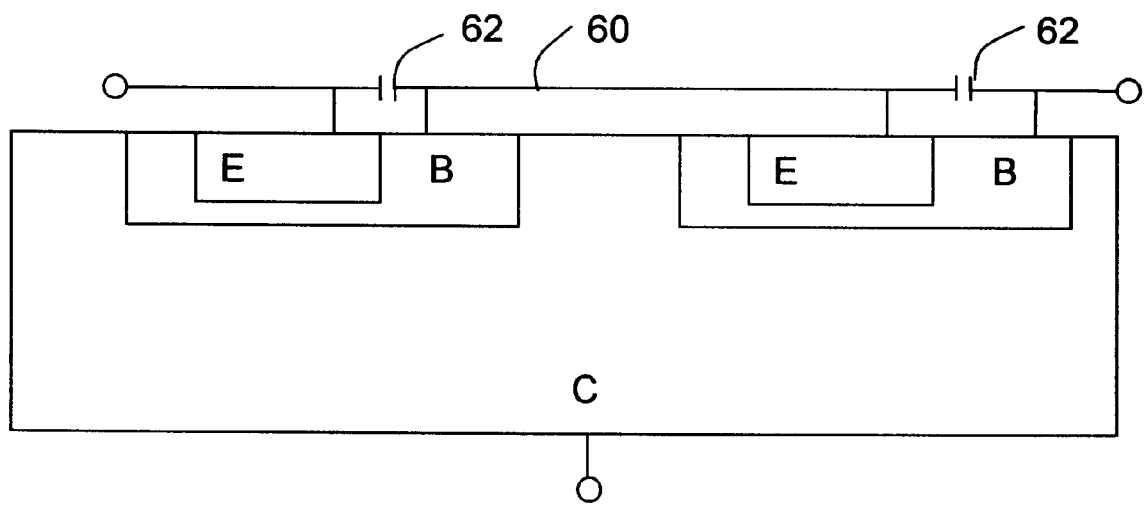
FIG. 4 illustrates the layout and connection of parasitic transistors of FIG. 3.

As shown in FIG. 4, the parasitic bipolar transistors are preferably p-n-p transistors formed by p-type diffusion in an n-well to form the emitter and base, respectively. The substrate acts as the collector. Since the bipolar transistors are connected in series, as indicated at 60, the intrinsic emitter-base capacitance, illustrated as capacitor 62, will decrease as the number of transistors increase. It will be appreciated that the capacitive loading on pad 20 may be decreased as the number of transistors 40 and 50 increase; but such a decrease is at the expense of the effectiveness of the over-voltage clamp. In most circuit applications, it is preferable to include between seven (7) and ten (10) parasitic bipolar transistors connected in series for each pad 20 on the integrated circuit. This will set the over-voltage clamp at about 4.9 volts and 7.0 volts, respectively, above Vdd by transistors 40 and below Vss by transistors 50. The over-voltage clamp may be set higher by increasing the number of transistors or lower by decreasing the number of transistors. It will be appreciated that the actual voltage at which the clamp is set will depend on the particular process parameters, as well the number of transistors.

When a large positive-going surge at pad 20 exceeds the protection level provided by MFETs 12 and 16 (see Table 1, column 3), it is shunted to the Vss bus by transistors 42–48. When a negative-going surge is applied to pad 20, it is shunted to Vdd by transistors 52–58. Since transistors 42–48 and 52–58 contribute leakage current (i.e., on the order of microamperes of current due to P-N junction leakage), discretion must be exercised to determine if performance characteristics would be degraded. For example, in a high speed sample and hold circuit, leakage current may lead to a discharge of the sampled voltage maintained on a capacitor prior to completion of the measurement. In such instances, the ESD protection circuit of the present invention should be that of FIG. 2. However, if pad 20 is connected to an amplified output, the signal may be sufficient to drive transistors 40 and 50 without degradation. In such applications, the ESD protection circuit could be that shown in FIG. 3.

While certain exemplary preferred embodiments have been described and shown in the accompanying drawings, it is to be understood that such embodiments are merely illustrative of and not restrictive on the broad invention. Further, it is to be understood that this invention shall not be limited to the specific construction and arrangements shown and described since various modifications or changes may occur to those of ordinary skill in the art without departing from the spirit and scope of the invention as claimed.

I claim:

1. In a semiconductor device having at least a positive, low impedance, power bus (Vdd) and a negative, low impedance, power bus (Vss) and at least one input or output signal line terminating at a pad, said at least one signal line having at least one circuit element susceptible to damage from a high voltage transient surge, a protection circuit comprising:

a first charge dissipation circuit positioned between and coupling said pad to said positive power bus; said first charge dissipation circuit having capacitive coupling between a gate and drain electrode for detecting negative transient voltage spikes at said pad and for biasing said charge dissipation circuit into a low impedance path to shunt said voltage transient to said positive power bus;

a second charge dissipation circuit positioned between and coupling said pad to said negative power bus; said second charge dissipation circuit having capacitive coupling between a gate and drain electrode for detecting positive transient voltage spikes at said pad and for biasing said charge dissipation circuit into a low impedance path to shunt said voltage transient to said negative power bus;

a first plurality of transistors with a first bipolar transistor having an emitter coupled to said pad and a second bipolar transistor having a base coupled to said power bus and includes a plurality of base-emitter junctions coupled therebetween; and a second plurality of transistors with a first bipolar transistor having a base electrode coupled to said pad and a second bipolar transistor having an emitter electrode coupled to said power bus and includes a plurality of base-emitter junctions coupled therebetween; said first and second plurality of transistors providing a discharge path in parallel with said first and second charge dissipation circuits.

2. The protective circuit of claim 1 wherein said first charge dissipation circuit comprises:

a first field effect transistor having a drain electrode connected to said pad and a source electrode connected to said positive power supply; said first field effect transistor having a gate electrode capacitively coupled to said drain electrode; and means for minimizing accumulated charge at said gate electrode.

3. The protective circuit of claim 2 wherein said charge minimizing means comprises a second transistor having a gate and drain electrode coupled to the gate electrode of said first transistor and a source electrode coupled to said positive power bus.

4. The protective circuit of claim 3 wherein said first and second transistors comprise p-channel field effect transistors having a body connection coupled to said positive power bus.

5. The protective circuit of claim 1 wherein said second charge dissipation circuit comprises:

a third field effect transistor having a drain electrode connected to said pad and a source electrode connected to said negative power supply; said third field effect transistor having a gate electrode capacitively coupled to said drain electrode; and means for minimizing accumulated charge at said gate electrode.

6. The protective circuit of claim 5 wherein said charge minimizing means comprises a fourth transistor having a gate and drain electrode coupled to the gate electrode of said third transistor and a source electrode coupled to said negative power bus.

7. The protective circuit of claim 6 wherein said third and fourth transistors comprise n-channel field effect transistors having a body connection coupled to said negative power bus.

8. In a semiconductor device, a protection circuit at a signal input pad, said protection circuit comprising:

a first field effect transistor having a drain electrode connected to said signal input pad and a source electrode connected to a,first low impedance bus; said first field effect transistor having a gate electrode capacitively coupled to said drain electrode adapted to switch said first transistor to a low impedance state in response to a negative transient voltage surge;

a second field effect transistor having a source electrode connected to said signal input pad and a drain electrode connected to a second low impedance bus; said second field effect transistor having a gate electrode capacitively coupled to said source electrode adapted to switch said second transistor to a low impedance state in response to a positive transient voltage surge; and means for minimizing accumulated charge at said gate electrode of said first and second transistors.

9. The protective circuit of claim 8 Wherein said charge minimizing means comprises a third transistor having a gate and drain electrode coupled to the gate electrode of said first transistor and a source electrode coupled to said first low impedance bus and a fourth transistor having a gate and drain electrode coupled to the gate electrode of said second transistor and a source electrode coupled to said second low impedance bus.

10. The protective circuit of claim 9 wherein said first and third transistors comprise p-channel field effect transistors having a body connection coupled to said first low impedance bus and wherein said second and fourth transistors comprise n-channel field effect transistors having a body connection coupled to said second low impedance bus.

11. The protective circuit of claim 8 including a secondary over-voltage clamp, wherein said secondary over-voltage clamp comprises:

a first plurality of transistors having a first bipolar transistor with an emitter coupled to said pad and a second bipolar transistor with a base coupled to said first low impedance bus and having a plurality of base-emitter junctions coupled therebetween; and a second plurality of transistors having a first bipolar transistor with a base coupled to said pad and a second bipolar transistor with an emitter coupled to said second low impedance bus and includes a plurality of base-emitter junctions coupled therebetween.

12. In a semiconductor device having at least a positive, low impedance, power bus (Vdd) and a negative, low impedance, power bus (Vss) and at least one signal line terminating at a pad, said at least signal line having at least one circuit element susceptible to damage from a high voltage transient surge, a protective circuit comprising:

a first charge dissipation circuit positioned between and coupling said pad to said positive power bus; said first charge dissipation circuit having capacitive coupling between a gate and drain electrode for detecting negative transient voltage spikes at said pad and for biasing said charge dissipation circuit into a low impedance path to shunt said voltage transient to said positive power bus; and a second charge dissipation circuit positioned between and coupling said pad to said negative power bus; said second charge dissipation circuit having capacitive coupling between a gate and source electrode for detecting positive transient voltage spikes at said pad and for biasing said charge dissipation circuit into a low impedance path to shunt said voltage transient to said negative power bus;

said first charge dissipation circuit comprising:

a first field effect transistor having a drain electrode connected to said pad and a source electrode connected to said positive power supply, said first field effect transistor having said gate electrode capacitively coupled to said drain electrode; and means for minimizing accumulated charge at said gate electrode.

13. The protective circuit of claim 12 wherein said charge minimizing means comprises a second transistor having a gate and drain electrode coupled to the gate electrode of said first transistor and a source electrode coupled to said positive power bus.

14. The protective circuit of claimed 13 wherein said first and second transistors comprise p-channel field effect transistors having a body connection coupled to said positive power bus.

15. The protective circuit of claim 12 herein said second charge dissipation circuit comprises:

a third field effect transistor having a drain electrode connected to said pad and a source electrode connected to said negative power supply; said third field effect transistor having said gate electrode capacitively coupled to said drain electrode; and means for minimizing accumulated charge at said gate electrode.

16. The protective circuit of claim 15 wherein said charge minimizing means comprises a fourth transistor having a gate and drain electrode coupled to the gate-electrode of said third transistor and a source electrode coupled to said negative power bus.

17. The protective circuit of claim 16 wherein said third and fourth transistors comprise n-channel field effect transistors having a body connection coupled to said negative power bus.

18. The protective circuit of claim 12 wherein said protective circuit further includes an over-voltage clamp comprising:

a first plurality of bipolar transistors coupled between said pad and said positive power bus;

a second plurality of bipolar transistors coupled between said pad and said negative power bus.

19. The protective circuit of claim 18 wherein:

said first plurality of transistors comprise a first bipolar transistor having an emitter coupled to said pad and a second bipolar transistor having a base coupled to said power bus and includes a plurality of base-emitter junctions coupled therebetween; and said second plurality of transistors comprise a first bipolar transistor having a base coupled to said pad and a second bipolar transistor having an emitter coupled to said power bus and includes a plurality of base-emitter junctions coupled therebetween.

20. In a semiconductor device where signal input pads and signal output pads have signal frequencies of at least 100 MHz, a circuit for protecting said signal inputs and said signal outputs a protection circuit at each of said pads, said protective circuit comprising:

a first field effect transistor having a drain electrode connected to said signal input pad and a source electrode connected to a first low impedance dissipation bus; said first field effect transistor having a gate electrode capacitively coupled to said drain electrode adapted to switch said first transistor to a low impedance state in response to a negative transient voltage surge;

a second field effect transistor having a drain electrode connected to said pad and a source electrode connected to a second low impedance bus; said second field effect transistor having a gate electrode capacitively coupled to said drain electrode adapted to switch to said second transistor to a low impedance state in response to a positive transient voltage surge;

means for minimizing accumulated charge at said gate electrode of said first and second transistors; and a secondary over-voltage clamp, wherein said secondary over-voltage clamp comprises:

a first plurality of transistors having a first bipolar transistor with an emitter coupled to said pad and a second bipolar transistor with a base coupled to said first low impedance bus and having a plurality of base-emitter junctions coupled therebetween; and a second plurality of transistors having a first bipolar transistor with a base coupled to said pad and a second bipolar transistor with an emitter coupled to said second low impedance bus and includes a plurality of base-emitter junctions coupled therebetween;

means for minimizing accumulated charge at said gate electrode of said first and second transistors.

21. In a semiconductor device having at least a positive, low impedance, power bus (Vdd) and a negative, low impedance, power bus (Vss) and at least one signal line terminating at a pad, said at least signal line having at least one circuit element susceptible to damage from a high voltage transient surge, a protective circuit comprising:

a first charge dissipation circuit positioned between and coupling said pad to said positive power bus; said first charge dissipation circuit having capacitive coupling between a gate and drain electrode for detecting negative transient voltage spikes at said pad and for biasing said charge dissipation circuit into a low impedance path to shunt said voltage transient to said positive power bus;

a second charge dissipation circuit positioned between and coupling said pad to said negative power bus; said second charge dissipation circuit having capacitive coupling between a gate and source electrode for detecting positive transient voltage spikes at said pad and for biasing said charge dissipation circuit into a low impedance path to shunt said voltage transient to said negative power bus; and an over-voltage clamp comprising:

a first plurality of bipolar transistors coupled between said pad and said positive power bus; and a second plurality of bipolar transistors coupled between said pad and said negative power bus;

said first charge dissipation circuit comprising:

a first field effect transistor having a drain electrode connected to said pad and a source electrode connected to said positive power supply, said first field effect transistor having said gate electrode capacitively coupled to said drain electrode;

means for minimizing accumulated charge at said gate electrode.

22. The protective circuit of claim 21 wherein:

said first plurality of transistors comprise a first bipolar transistor having an emitter coupled to said pad and a second bipolar transistor having a base coupled to said power bus and includes a plurality of base-emitter junctions coupled therebetween; and said second plurality of transistors comprise a first bipolar transistor having a base coupled to said pad and a second bipolar transistor having an emitter coupled to said power bus and includes a plurality of base-emitter junctions coupled therebetween.

* * * * *